(12) United States Patent
Allenspach et al.

(10) Patent No.: US 9,276,196 B2
(45) Date of Patent: Mar. 1, 2016

(54) FERROMAGNETIC DEVICE PROVIDING HIGH DOMAIN WALL VELOCITIES

(75) Inventors: Rolf Allenspach, Rueschlikon (CH); Carl Zinoni, Horgen (CH)

(73) Assignee: International Business Machines Corporation, Armonk, NY (US)

(*) Notice: Subject to any disclaimer, the term of this patent is extended or adjusted under 35 U.S.C. 154(b) by 317 days.

(21) Appl. No.: 13/985,813

(22) PCT Filed: Feb. 3, 2012

(86) PCT No.: PCT/IB2012/050499
§ 371 (c)(1),
(2), (4) Date: Aug. 15, 2013

(87) PCT Pub. No.: WO2012/110909
PCT Pub. Date: Aug. 23, 2012

(65) Prior Publication Data
US 2013/0322151 A1  Dec. 5, 2013

(30) Foreign Application Priority Data
Feb. 16, 2011 (EP) .................................... 11154661

(51) Int. Cl.
*G11C 11/00* (2006.01)
*H01L 43/02* (2006.01)
(Continued)

(52) U.S. Cl.
CPC .............. *H01L 43/02* (2013.01); *G11C 11/16* (2013.01); *G11C 19/0808* (2013.01); *H01L 43/12* (2013.01)

(58) Field of Classification Search
CPC ....................................................... G11C 11/00
USPC ......... 365/48, 55, 62, 66, 74, 78, 80–93, 100, 365/129, 130, 131, 148, 158, 171–173, 209, 365/213, 225.5, 230.07, 232; 257/295, 421, 257/422, 427, E21.665, E27.006; 438/3; 977/933–935

See application file for complete search history.

(56) References Cited

U.S. PATENT DOCUMENTS 5,862,022 A * 1/1999 Noguchi ................. H01L 43/08
257/421
6,775,183 B2 * 8/2004 Heide .................... H01L 27/224
257/E27.005

(Continued)

FOREIGN PATENT DOCUMENTS

| CN | 101211652 A | 7/2008 |
|---|---|---|
| CN | 101217181 A | 7/2008 |

(Continued)

OTHER PUBLICATIONS

Schryer et al., "The motion of 180° domain walls in uniform dc magnetic fields", Journal of Applied Physics, vol. 45, No. 12, Dec. 1974, pp. 5406-5421.

(Continued)

*Primary Examiner* — Harry W Byrne
(74) *Attorney, Agent, or Firm* — Scully, Scott, Murphy & Presser, P.C.; David Quinn, Esq.

(57) ABSTRACT

The invention is directed to a ferromagnetic device (10), having an elongated structure extending along a longitudinal direction (11), comprising a ferromagnetic material, wherein a transverse cross section (20) of the ferromagnetic material, perpendicular to said longitudinal direction, is designed to provide a domain wall velocity above the Walker breakdown limit of the ferromagnetic material. In particular, at least a portion (21-23) of a peripheral contour of the ferromagnetic material forms, in the transverse cross-section (20), a non-orthogonal convex set. For example, the whole peripheral contour may realize a (non-orthogonal) convex polygon.

12 Claims, 5 Drawing Sheets

(51) Int. Cl.
*G11C 19/08* (2006.01)
*G11C 11/16* (2006.01)
*H01L 43/12* (2006.01)

(56) References Cited

U.S. PATENT DOCUMENTS

| | | | |
|---|---|---|---|
| 6,798,689 B2* | 9/2004 | Muller | B82Y 10/00 257/E21.665 |
| 6,834,005 B1 | 12/2004 | Parkin | |
| 6,898,132 B2 | 5/2005 | Parkin | |
| 6,920,062 B2 | 7/2005 | Parkin | |
| 7,031,178 B2 | 4/2006 | Parkin | |
| 7,236,386 B2 | 6/2007 | Parkin | |
| 7,554,834 B2* | 6/2009 | Wunderlich | G11C 11/16 365/158 |
| 8,310,866 B2* | 11/2012 | Leuschner | B82Y 25/00 365/158 |
| 2006/0209590 A1* | 9/2006 | Guo | G11C 11/15 365/158 |
| 2008/0152794 A1 | 6/2008 | Lim et al. | |
| 2008/0160349 A1 | 7/2008 | Lim | |
| 2008/0231392 A1 | 9/2008 | Kim et al. | |
| 2010/0134923 A1 | 6/2010 | Clinton et al. | |
| 2012/0098534 A1 | 4/2012 | Hertel et al. | |
| 2012/0134923 A1 | 5/2012 | Avory et al. | |

FOREIGN PATENT DOCUMENTS

| | | |
|---|---|---|
| KR | 20090027362 A | 3/2009 |
| WO | WO 03/083874 | 10/2003 |
| WO | WO 2007/037625 | 4/2007 |
| WO | WO 2010/130240 A1 | 11/2010 |
| WO | WO 2012/110909 A1 | 8/2012 |

OTHER PUBLICATIONS

Beach et al., "Dynamics of field-driven domain-wall propagation in ferromagnetic nanowires", nature materials, vol. 4, Oct. 2005, pp. 741-744.

Parkin et al., "Magnetic Domain-Wall Racetrack Memory", Science 320, 190 (2008), Downloaded from www.sciencemag.org on Apr. 17, 2008, pp. 190-194.

Allwood et al., "Magnetic Domain-Wall Logic", Science 309, 1688 (2005), Downloaded from www.sciencemag.org on May 20, 2009, pp. 1688-1692.

Gross et al., "Fabrication of ultrathin magnetic structures by nanostencil lithography in dynamic mode", Applied Physics Letters 90, 2007 American Institute of Physics, Downloaded on Mar. 2, 2007, pp. 093121-1-093121-3.

Vanhaverbeke et al., "Control of Domain Wall Polarity by Current Pulses", 2008 The American Physical Society, PRL 101, (2008), Sep. 5, 2008, pp. 107202-1-107202-4.

Allwood et al., "Submicrometer Ferromagnetic NOT Gate and Shift Register", Science, vol. 296, Jun. 14, 2002, pp. 2003-2006.

Donahue et al., "OOMMF User's Guide", National Institute of Standards and Technology Interagency Report No. NISTIR 6376 (1999), Jan. 15, 2004, pp. 1-109.

Cowburn et al., "Spintonics Turbulence Ahead", nature materials, vol. 4, Oct. 2005, pp. 721-722.

Nakatani et al., "Faster magnetic walls in rough wires", nature materials, vol. 2, Aug. 2003, pp. 521-523.

Glathe et al., "Experimental study of domain wall motion in long nanostrips under the influence of a transverse field", Applied Physics Letters 93, 162505 (2008), Downloaded Apr. 15, 2010, pp. 162505-1-162505-3.

Seo et al., "Controllable chirality switching of a moving domain wall by oblique magnetic field", Applied Physics Letters 97, (2010), Downloaded Aug. 30, 2010, pp. 032507-1-032507-3.

Bryan et al., "Magnetic domain wall propagation in nanowires under transverse magnetic fields", Journal of Applied Physics 103, (2008), Downloaded Aug. 30, 2010, pp. 073906-1-073906-6.

Kunz et al., "Fast domain wall motion in nanostripes with out-of-plane fields", Applied Physics Letters 93, (2008), Downloaded Apr. 15, 2010, pp. 082503-1-082503-3.

Weerts et al., "Suppression of complex domain wall behavior in Ni80Fe20 nanowires by oscillating magnetic fields", Applied Physics Letters 96, (2010), Downloaded Aug. 30, 2010, pp. 062502-1-062502-3.

You, "Another method for domain wall movement by a nonuniform transverse magnetic field", Applied Physics Letters 92, (2008), Downloaded Jun. 27, 2008, pp. 152507-1-152507-3.

Lee et al., "Remarkable enhancement of domain-wall velocity in magnetic nanostripes", Appl. Phys. Lett. 91, (2007) Downloaded Aug. 14, 2013, pp. 122513-1-122513-3.

Nakatani et al., "Head-to-head domain walls in soft nano-strips: a refined phase diagram", Science Direct, Journal of Magnetism and Magnetic Materials 290-291, available online Dec. 15, 2004, (2005), pp. 750-753.

Hayashi et al., "Direct observation of the coherent precession of magnetic domain walls propagating along permalloy nanowires", Nature Publishing Group, Nature Phsyics, vol. 3, Jan. 2007, pp. 21-25.

Lee et al., "Dynamic transformations of the internal structure of a moving domain wall in magnetic nanostripes", Physical Review B 76, (2007), Nov. 8, 2007, pp. 184408-1-184408-8.

Min et al., "Effects of Disorder and Internal Dynamics on Vortex Wall Propagation", Physical Review Letters, PRL 104, 217201 (2010), May 28, 2010, pp. 217201-1-217201-4.

Weerts et al., :Influence of pulse amplitude and rise time on field-induced domain wall propagation in Ni80Fe20 nanowires, Journal of Applied Physics 103, (2008), Downloaded Aug. 30, 2010, pp. 094307-1-094307-4.

Lewis et al., "Fast domain wall motion in magnetic comb structures", Nature Materials, vol. 9, Dec. 2010, pp. 980-983.

Examination Report dated Jun. 8, 2015 received from the Great Britain Patent Office in related application No. GB1310338.7.

* cited by examiner

FERROMAGNETIC DEVICE PROVIDING HIGH DOMAIN WALL VELOCITIES

FIELD OF THE INVENTION

The invention relates to the field of domain-wall based spintronics devices, such as wires comprising a ferromagnetic material.

BACKGROUND OF THE INVENTION

Domain-wall (DW) based spintronics devices rely on moving domain walls in confined geometries such as narrow ferromagnetic wires. The higher the speed of the domain wall, the faster are these devices. Domain wall velocities typically range from 1 m/s to 100 m/s, and are determined by the driving source and geometry. Walls are pushed along by magnetic fields or by spin-polarized currents. The dependence of domain wall velocity v on magnetic field H is usually defined by the mobility curve model description by Schryer and Walker [1]. At relatively low fields, the velocity is known to scale linearly with the field, v~H, up to a certain limiting field (the so-called "Walker breakdown field" or equivalently the "Walker breakdown current" and more generally the "Walker breakdown limit") at which the wall velocity peaks. According to this model, above that field, the domain wall motion becomes turbulent, leading to a reduction of v with increasing H, until at large fields v increases again [2]. A similar dependence holds if a spin-polarized current is used rather than a field.

A prototypical domain wall device is the magnetic racetrack [3, 4], alternatives are logic concepts such as Cowburn's magnetic domain wall logic [5]. The domain walls, shuttled through the circuit by current or field, need to stay intact to the extent that the intended logic operation can be performed. Therefore, the applied field or current is kept low to ensure that one stays in the linear regime of the mobility curve and, correspondingly, velocities remain limited.

The possibility to manipulate the dynamic response of a DW and to enhance DW velocity beyond the Walker breakdown limit has been proposed. However, the realization of a practical device [3, 8] that implements high DW velocities remains elusive due to the technological complexity or due to the modest velocity increase.

The references provided at the end of the present description provide useful information as to the background art of the present invention.

BRIEF SUMMARY OF THE INVENTION

In one embodiment, the present invention provides a ferromagnetic device for spin-based information storage or processing apparatus, having an elongated structure extending along a longitudinal direction, comprising a ferromagnetic material, wherein a transverse cross section of the ferromagnetic material, perpendicular to said longitudinal direction, is designed to provide domain wall velocities substantially larger than a domain wall velocity as obtained at the Walker breakdown limit of the ferromagnetic material.

In other embodiments, the said device may comprise one or more of the following features:
the transverse cross section is designed to substantially prevent vortex or antivortex nucleation off edges of the transverse cross section;
a thickness of the ferromagnetic material is reduced at the level of one or more lateral edges of the transverse cross-section, preferably along a width of 10-30 nm;
at least a portion of a peripheral contour of the ferromagnetic material forms, in the transverse cross-section, a non-orthogonal convex set;
the ferromagnetic material comprises species conferring a ferromagnetic character to the ferromagnetic material, and at least a portion of a peripheral contour of density of said species forms a non-orthogonal convex set in the transverse cross section;
said at least a portion of peripheral contour has a plano-convex shape;
a peripheral contour of the ferromagnetic material is asymmetric with respect to a mean plane of the elongated structure;
said peripheral contour realizes substantially an almost convex or convex polygon;
said ferromagnetic material comprises a nickel-iron magnetic alloy;
one or more lateral edges of the elongated structure are thinned or tapered edges;
a density of species that confers a ferromagnetic character to the ferromagnetic material is substantially not uniform in the transverse-cross section; and
the device further comprises chemical species such as dopants implanted therein, arranged such that at least a portion of a peripheral contour of density of said species that confers the ferromagnetic character forms a non-orthogonal convex set in the transverse cross section;

According to another aspect, the invention is embodied as a method of manufacturing a ferromagnetic device according to any one of the embodiments above.

In yet another aspect thereof, the invention is embodied as a method of operating a ferromagnetic device according to any one of the above embodiments, comprising a step of moving domain walls at velocities substantially larger than the velocity as obtained at the Walker breakdown limit of the ferromagnetic material.

According to a final aspect, the invention is embodied as a spin-based information storage or processing apparatus comprising the ferromagnetic device according to any one of the above embodiments.

Devices and methods embodying the present invention will now be described, by way of non-limiting examples, and in reference to the accompanying drawings.

DETAILED DESCRIPTION OF THE INVENTION

Figure 1:
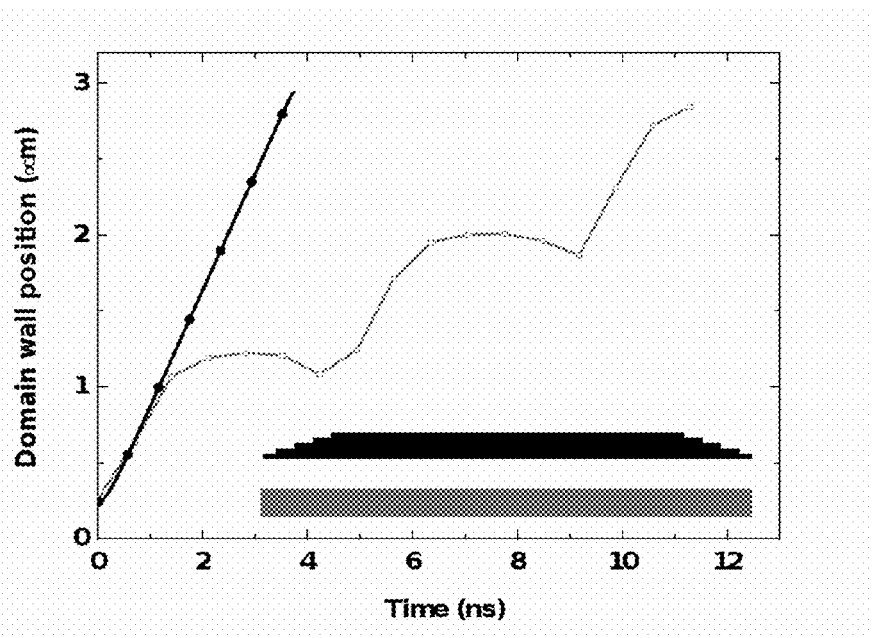
FIG. 1 shows the results of micromagnetic simulations of domain wall displacement in permalloy ($Ni_{80}Fe_{20}$) as a function of time in a narrow wire with rectangular (red empty circles) and plano-convex (black filled circles) cross-sections, the latter according to embodiments of the invention. The cross section of the wire geometries used in the simulation is shown in the inset; the rectangular wire is 80 nm wide and 5 nm thick.

As an introduction to the following description, the context of the present invention is briefly outlined.

Present inventors have tackled DW dynamics in wide permalloy wires (300 nm to 900 nm), having a thickness of 20 nm, to understand the fundamental mechanisms that limit DW mobility. The change in the DW structure as it evolves along the wire was captured by magneto-optical Kerr effect, a technique capable to detect the magnetization signal locally, see e.g., ref. [2]. The dynamics of vortex DWs was found to depart significantly from the current description, i.e., that of a compact entity evolving along the wire. Micromagnetic simulations made it possible to reproduce the measured mobility curve and evidence that the DW is composed of several substructures, each one propagating and evolving in a different dynamic regime with very different velocities.

With the insight gained into this complex dynamics, inventors proposed and simulated structure profiles suitable for high speed device applications, and which overcome the limits imposed by the Walker breakdown.

In somewhat more details, micromagnetic simulations were performed on nanowires with standard rectangular cross-sections. In wires wide enough to support vortex walls, it was found that a critical ingredient determining wall propagation at fields above nominal Walker breakdown is the interaction of the vortex core with the two half antivortices accompanying the vortex core, which are located at both (lateral) edges of the wire, and the corresponding rebalancing of the magnetic energies (exchange, dipolar, and Zeeman terms).

The interaction of the vortex core with the two half antivortices at the edges is asymmetric. For a given symmetry, the interaction with the antivortex in front of the vortex core (at the leading edge) can be energetically favorable. Two completely different scenarios can then be distinguished. Once a vortex core hits the edge, it can either be reflected and again traverse the wire cross section or it can remain confined in the vicinity of the edge, sliding along the edge under the applied field (or current). As it can be realized, the second process can lead to fast wall propagation. Namely, the domain wall uses the precessional torque to achieve a high velocity, whereas in the first process the vortex core undergoes oscillatory dynamics and the forward motion is damped. Interestingly, in the second process, the main part of the wall moves without relevant spin structure change, even though we are in a regime above the Walker breakdown field where a chaotic, oscillating wall motion would a priori be expected. The obtained experimental data taken by magneto-optical Kerr microscopy have confirmed the micromagnetic simulations on permalloy wires of 840 nm width and 20 nm thickness.

Thus, one may want to exploit the fact that if the magnetization of a half antivortex remains unchanged and correspondingly the vortex core is not reflected, then the drop in velocity can be avoided. Accordingly, what is proposed here is to geometrically structure the wire, and in particular a transverse cross-section thereof such that the vortex core reflection off the edge of the wire is prevented. As a result, domain wall velocities v are obtained which are substantially larger than the velocity $v_{WBL}$ as obtained for the Walker breakdown limit. Substantially larger velocities means typically $v=fv_{WBL}$, with f>1.3, preferably f>1.5, possibly f>2. The exact factor f obtained shall depend on the precise geometry used (higher values can thus be contemplated). In the following, such velocities shall be referred to as "velocities above the Walker breakdown limit", or even "increased velocities", for simplicity.

This can notably be achieved thanks to a cross sectional profile such as a plano-convex lens shape with rounded edges. As to be discussed in details below, alternative geometries are possible.

In this respect, FIG. 1 shows the calculated DW displacement as a function of time in a narrow wire with rectangular (red empty circles) and the plano-convex (black filled circles) cross-section of the ferromagnetic device, for otherwise identical parameters and driving field. Thus, domain wall motions as obtained with these two profiles can be compared. The cross section of the wire geometries used in the simulation is shown in the inset; the rectangular wire is 80 nm wide and 5 nm thick. The dimensions used for that simulation favor a transverse wall rather than a vortex wall.

A remarkable speed-up of the DW is observed in the lens-shaped wire compared to the rectangular cross section. A possible explanation follows: during the DW propagation, the injection of the antivortex core into the wire is prevented by the demagnetization energy at the wire edge. In the wire with the rectangular profile, the DW has to go through more than two full precessional cycles before it reaches the end of the simulated wire, by propagating the antivortex nucleated at the edges along the wire width.

Therefore, according to what precedes, increased DW velocities can manifestly be observed with both vortex and transverse walls. This can be understood by the fact that also the motion of transverse walls involves reversal through an antivortex at the wire edge [7]. Hence, the present concept (DW velocities increased beyond the limit imposed by the energetics in rectangular walls) holds for both types of DWs, as encountered in nanowires.

Incidentally, for some applications (e.g., to small devices), narrow wires such as used for the simulation of FIG. 1 (i.e., having transverse walls), might be preferable.

Building on this observation, inventors have devised a variety of novel ferromagnetic devices suited for spin-based information storage or processing apparatuses, described below in reference to FIGS. 2-13. As usual, such ferromagnetic devices 10 comprise a ferromagnetic material, e.g., a nickel-iron magnetic alloy and have an elongated structure, e.g., a wire, extending along a longitudinal direction 11, which is here taken to coincide with the z-axis of the depicted Cartesian coordinate system 1. The longitudinal axis is the main axis of the elongated structure, see e.g., FIG. 2. The x-axis is the vertical axis and y denotes the lateral or transverse axis. Reference 1' denotes a translated triplet of unit vectors.

As we shall see, the depicted devices allows for providing domain wall velocities above the Walker breakdown limit of the ferromagnetic material, whereby high-speed operation of the devices become possible. To achieve this, the main idea is to modify the transverse cross section 20 of ferromagnetic material, i.e., perpendicular to the longitudinal axis (z-axis). Importantly, the modified cross sectional profile 20 is not necessarily that of the whole structure 10. It is first and foremost the cross section of the sole ferromagnetic material. Typically, said transverse cross section exhibits substantially a same type of pattern along the longitudinal direction. Furthermore, the dimensions and shape of said pattern preferably remains the same (i.e., the pattern is constant along that direction). Incidentally, while it is here often alluded to a "longitudinal direction", ferromagnetic devices such as described herein may find applications in spin-based information storage or processing apparatuses as linear devices or U-shaped devices (see e.g., FIG. 17). Yet, in all cases, the ferromagnetic devices keep an elongated structure, such that it makes sense to speak of a longitudinal direction; the transverse cross-section is a section perpendicular to a local, longitudinal direction. A typical width of the transverse cross section is at least 30 nm, and preferably between 100 nm and 1000 nm, with a height of at least 3 nm, preferably between 5 nm and 30 nm.

As discussed earlier, the present solution can be described as providing a transverse cross-section 20 designed such as to prevent vortex or antivortex nucleation off edges 21, 22 of the transverse section 20. Having realized that, many practical solutions can be contemplated. Yet, independently of the underlying physics (vortex nucleation, etc.), several practical embodiments can be designed, wherein the transverse section of the wire is modified in order to achieve increased domain wall velocities in practice.

Figure 4:
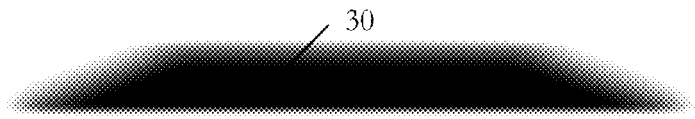
FIG. 4 is a density plot of ferromagnetic species in a ferromagnetic device according to embodiments.
Figure 5:
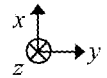
FIG. 5 shows the corresponding density contours, together with density contours of implanted species, according to embodiments.
Figure 5:

For instance, a possibility is to directly alter the geometry of the section 20 of the whole structure 10, i.e., the external envelope (FIGS. 1-3, 6-8). Another possibility is to modify only the distribution of the species conferring the ferromagnetic character to the material, irrespective of the actual structure of the device 10 (FIGS. 4, 5). In all cases, the geometry of a peripheral contour of the ferromagnetic material is altered with respect to the highly symmetric wire usually employed (i.e., a rectangular profile). This is explained in more details now.

Figure 2:
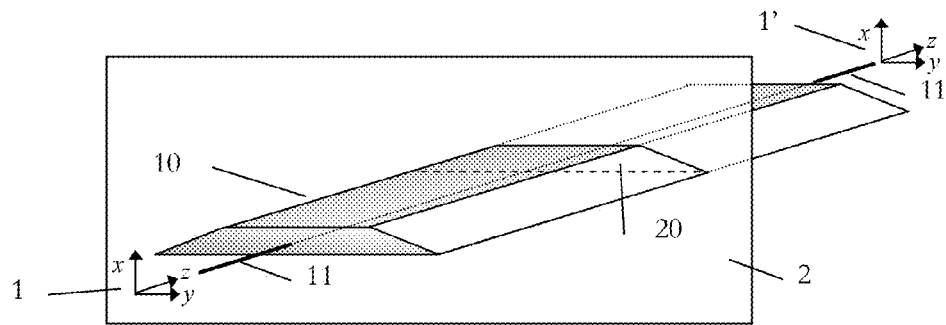
FIG. 2 is a simplified 3D view of a part of a ferromagnetic device according to embodiments.

FIG. 2 shows a simplified 3D view of a ferromagnetic device 10, according to actual embodiments of the present invention. As said, the wire has a generally elongated structure, whose main axis 11 coincides with the z-axis. The transverse cross section 20 is the intersection of the wire 10 with a plane 2 perpendicular to the z-axis. In this example, the transverse cross section 20 has a generally plano-convex shape. With such a profile, the thickness of the structure towards a lateral edge is (partly) reduced while a rather smooth profile is maintained. Smoothness is advantageous to prevent excessive pinning. A thickness reduction towards the edge changes the energetics completely, as demagnetization energy is strongly enhanced for smaller thicknesses. For example, in FIG. 1 the width of the tapered edge region is about 12 nm (thickness goes from 5 nm down to 1 nm along said 12 nm). An appropriate width (wherein thickness is reduced) is that which is equal or larger than the width of the (anti)vortex that the system is trying to nucleate, in operation. The exact value depends on the material chosen but is typically close to 20 nm, and a typical range of suitable values is 10-30 nm.

Figure 3:
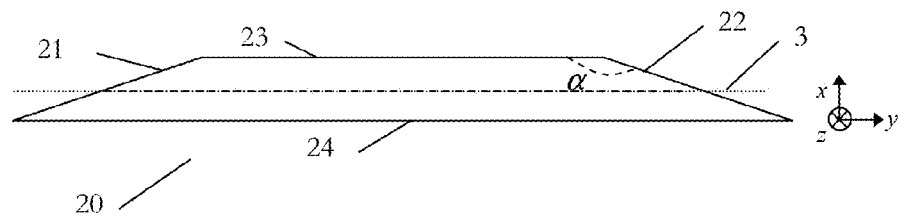
FIG. 3 shows a corresponding transverse cross-section section.

FIG. 3 shows a corresponding 2D view of the section 20, the z-axis being now perpendicular to the drawing plane. Lateral edges 21, 22 of the section 20 are oblique, i.e., inclined at an angle (≠90° or 180°) with respect to the transverse edges 23, 24. Typically, one has $90°<\alpha<180°$, preferably $110°<\alpha<160°$ and more preferably $120°<\alpha<150°$. Such values typically give increasing quality results in practice.

In FIG. 3, edges 21-24 form a convex set (yet not orthogonally convex): for every pair of points within the contours formed by edges 21-24, every point on a line segment joining said pair is contained within the same contours. The depicted edge set confers a trapezoidal shape to the section 20. More generally, a plano-convex shape is convenient. By "generally plano-convex shape", it is meant a shape (e.g., edges 21, 23, 22) within which a plano-convex line can be inscribed. The thickness of the structure is accordingly reduced towards the edges, while a smooth profile is maintained. As said earlier, smoothness allows for preventing excessive pinning, whereas thickness reduction substantially enhances the demagnetization energy. As a result, increased DW velocities can be obtained.

More generally, reducing the thickness of ferromagnetic material at the level of one or more lateral edges (21, 22) of the transverse section is a sufficient condition to achieve the desired technical effect. In particular, cross-sections that realize a (non-orthogonally) convex polygon (such as FIG. 3) are suitable shapes.

Figure 15:
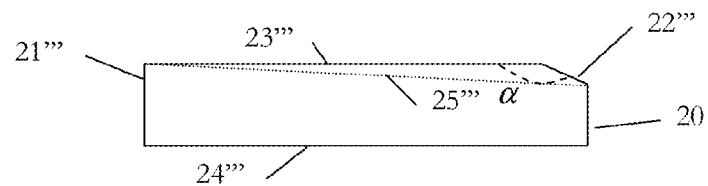

Yet, the condition can be lowered to having a cross-sectional shape 20 with at least one internal angle α chosen such that $90°<\alpha<180°$, as depicted in FIG. 15, which already provides the desired effect. In the example of FIG. 15, all angles are right angles but α. In other words, a portion of the peripheral contour forms a non-orthogonal convex set in the transverse section 20. Said portion of contour is formed by edges 21''', 23''', 22''', together with the (virtual) line segment 25'''. Providing a contour with at least a portion thereof forming a non-orthogonal convex set leads to the desired thickness reduction.

Figure 16:
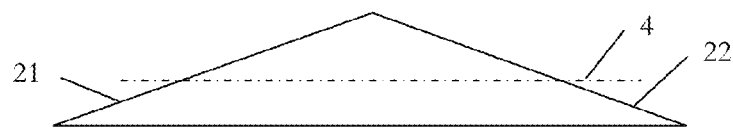

Still, a cross-sectional shape with one or more internal angles strictly less than 90° (≠) 90° may also provide the desired effect. For instance, this condition is readily fulfilled with triangular shapes, as illustrated in FIG. 16. Here, the triangular contours realize a convex set, which has reduced thickness at the level of the lateral edges 21, 22. Yet, be it for practical reasons, at least four edges (quadrangle) are preferred, which are easier to machine. In that case, the polygon has a lower symmetry compared to a rectangle. Furthermore, quadrangles allow for maintaining some degree of smoothness. Note that cutting the triangle of FIG. 16 at the level of the virtual line 4, one recovers a cross-sectional shape similar to that of FIG. 3.

To summarize: cross-sections with at least one internal angle α, $90°<\alpha<180°$, as in FIG. 15 or one or more internal angles strictly less than 90° provide the desired effect. Accordingly, and as seen from the embodiments of FIG. 3, 15 or 16 (at least), a class of suitable devices is one wherein at least a portion of the contours of the ferromagnetic material realize a (non-orthogonal) convex set in the transverse section 20.

Figure 6:
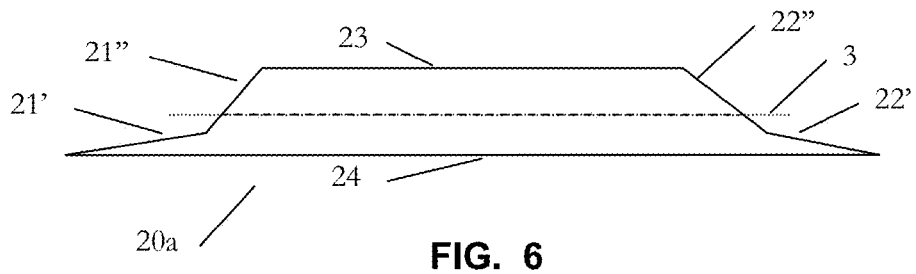
FIGS. 6-16 illustrate various possible shapes of transverse cross-sections of ferromagnetic material that can be used in devices according to embodiments.
Figure 7:
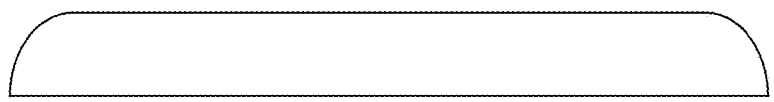
Figure 8:
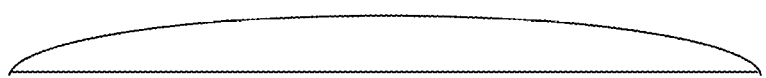
Figure 9:
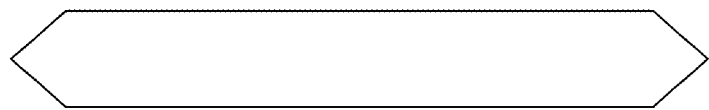
Figure 11:
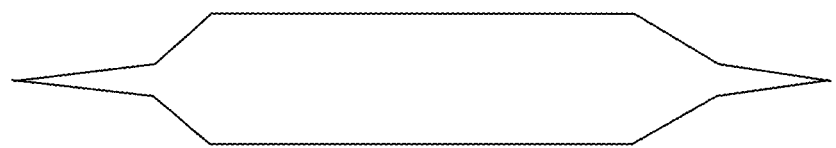
Figure 10:
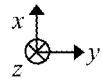
Figure 11:
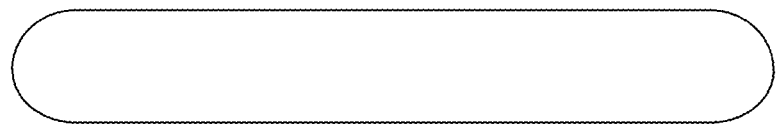
Figure 12:

This notably includes those devices for which the whole peripheral contour of ferromagnetic material draws a convex set (and at least not fully orthogonal). Now, the transverse cross-section 20 does not need to realize a perfectly convex polygon, as depicted in FIG. 6. In this example, the angle between edges 21' and 21" (or between 22' and 22") gives rise to non-convexity. Yet, the general shape remains mostly convex. More precisely, most proximal pairs of edges are convex. Thus, FIG. 6 gives another example wherein at least a portion of a peripheral contour of the ferromagnetic material forms a (non-orthogonal) convex set in the transverse section 20. Such shapes are believed to suitably avoid vortices/antivortices injection and reflection from lateral edges of the cross section 20.

Thus, as discussed above in reference to FIG. 3 or 6, preferred shapes are plano-convex or almost plano-convex. Such shapes are asymmetrical with respect to the mean (horizontal) plane 3 of the device.

Figure 14:
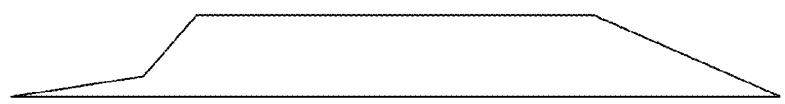

Yet, in variants, no xz reflection symmetry is required, as illustrated in FIG. 14 or 15.

In addition, in other variants, symmetrical cross sections (with respect to the mean plane 3) can be contemplated, provided that at least a portion (e.g., a half) thereof form a convex set (e.g., plano-convex or almost plano-convex), resulting in a reduced lateral thicknesses.

FIGS. 7-16 give examples of possible shapes for the peripheral contour of the ferromagnetic material in the transverse cross-section 20.

Figure 13:
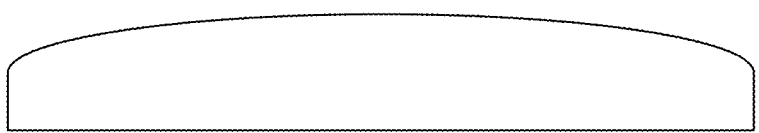

To summarize:

In each case, at least a portion (e.g., the upper portion) of the peripheral contour of the ferromagnetic material forms a non-orthogonal convex set, giving rise to reduced thickness at one or more lateral edge(s), see e.g., FIG. 15;

However, not all sub-portions need be non-orthogonally convex, see e.g., FIG. 13 or 15;

The whole peripheral contour can form a convex set, see FIGS. 3, 7-9, 11-13, 15-16, possibly orthogonal in part, see FIG. 13 or 15. note that keeping some of the edges "orthogonal" may simplify the manufacturing process in some cases;

Lateral symmetry (xz reflection) is not systematically required, see FIG. 14 or 15, although it improves smoothness macroscopically; and The peripheral contour of the ferromagnetic material may be asymmetrical with respect to the mean plane of the device (as in FIG. 2-8, 13-16) or not (FIGS. 9-12), such that plano-convex or bi-convex shapes can be contemplated;

Yet, the sectional profile do not need to be fully convex, inasmuch as almost convex shapes (FIG. 6 or 14) or almost bi-convex shapes (FIG. 10) may suffice; and Rounded edges also provide the desired effect, see FIGS. 7, 8, 11, and 13 (no straight edge is required, although it may be easier to process).

Next, the desired peripheral contour shapes can be obtained in various manners. As said, a first possibility is to directly work the shape of the whole structure 10. Another possibility consists of modifying the distribution of species conferring the ferromagnetic character to the ferromagnetic material, e.g., at the level of lateral edges.

In the latter case, preferred variants are those wherein a portion (at least) of a peripheral contour of the density of said species forms a non-orthogonal convex set, as described previously. In this regards, the contours depicted in FIGS. 3, 6-16 may also be conceived as an outermost density contour of the ferromagnetic species (rather than the external envelope of the structure 10) and this, irrespective of the actual shape of the device. Thus, since the ferromagnetic material needs not span the entire transverse cross-section of the structure, one understands that the transverse section of the elongated structure does not necessarily need to have a reduced thickness at the edges. Rather, one may seek to modify the geometry of the sole ferromagnetic material in order to achieve the desired technical effect.

In this respect, the present invention is also generally directed to a method of manufacture of a ferromagnetic device as described herein. In particular, this method may comprise a step of modifying the distribution of the ferromagnetic species at the level of one or more lateral edges (such as edges 21, 22 in FIG. 3).

In this regards, one may use any process suitable for modifying the distribution of such species. As a result, the density of ferromagnetic species (i.e., the number of particles per volume unit) is non-uniform in a transverse section. Namely, it decreases in the direction of lateral edges, such as to draw a desired shape. Therefore, one distinguishes dense regions (forming the desired shape) from low-density regions, completing the dense regions such as to form any practical profile, e.g., a rectangle. This situation is illustrated in FIGS. 4 and 5.

FIG. 4 schematically depicts a density plot (free scale) corresponding to a (non-uniform) distribution of ferromagnetic species. In this gray scale figure, the regions comprising more ferromagnetic species are shown darker. These denser regions effectively result in a polygonal shape similar to that of FIG. 3, leading substantially to the same effects.

Modifying the ferromagnetic species distribution can for instance be achieved by way of additional chemical species (i.e., nonmagnetic dopants), implanted such as to impact the peripheral density of the ferromagnetic particles. In this respect, FIG. 5 schematically illustrates density contours of the two species. Contours $C_0$, $C_1$ and $C_2$ (plain lines) are typical contours associated to respective density levels $P_0$, $P_1$, $P_2$ of ferromagnetic species. Typically, the value $P_0$ corresponds essentially to the density of species in the bulk and $P_2 = x_1 P_1 = x_0 P_0$ ($0 < x_0 < x_1 < 1$). Similarly, $c_0$, $c_1$ and $C_2$ (dashed lines) are contours associated to density levels $\rho_0$, $\rho_1$, $\rho_2$ of implanted species (or dopants), with $\rho_2 = y_1 \rho_1 = y_0 P_0$ ($0 < y_0 < y_1 < 1$).

In each of the above embodiments, the idea is that an appropriate geometry of the ferromagnetic cross-section (e.g., having reduced wire thickness or density at the level of the edges) might be used to enhance the demagnetization energy towards the edges.

Lens-shaped structures can for instance be realized by using shadow masks inserted in the growth chamber to locally change the growth rate as used in the nanostencil dynamic mode technique [6], by multistep lithography, or by shaping the magnetic profile of the wire by doping with nonmagnetic impurities. Such techniques are known per se.

In conclusion, the invention described above advantageously exploits the fact that a domain wall propagating in a wide structure undergoes a radical transformation because different parts of the DW propagate in different dynamic regimes, i.e., a significant departure from the accepted concept of a compact magnetic structure evolving along the wire length. These conclusions are drawn from a combined experimental and micromagnetic simulation study. With the knowledge gained, a concept for achieving enhanced velocities is proposed, based on modifications of the cross-sectional structure which deemphasize magnetostatic energy contributions.

A brief description of some of the experimental and theoretical methods used to validate the above concept follows.

Sample fabrication. Samples were fabricated on a Si wafer covered by 5 nm thermal oxide in two evaporation and lift-off steps. In the first step, 20 nm $Fe_{20}Ni_{80}$ was evaporated in structures defined by electron-beam lithography, and capped by 3 nm Pt to avoid oxidation of the ferromagnet when exposed to air. The wires are tapered at one end to prevent DW nucleation and contain a 3.5 µm by 3.5 µm square pad at the other end to lower the reset field. A second lithography step is used for defining the DW nucleation bridges made of 60 nm Pt. A current pulse is sent through this bridge, accompanied by a magnetic field pulse which creates a domain wall pair. A coplanar waveguide to deliver high frequency pulses was defined in an optical lithography step and 80 nm Au and 10 nm Ti were then sputtered. The coercive field of the continuous film was measured to be 0.16 kA/m while the patterned wire had a coercive field of 0.37 kA/m, suggesting that edge roughness introduced by patterning contributes significantly to the coercive field.

Micromagnetic simulations. The simulations were done with the OOMMF code [9], on wires 30 µm long, 840 nm wide, and 20 nm thick to fully reproduce the experimental wire geometry used for mobility curves measurements. The cell size was 5 nm×5 nm×20 nm, the material parameters are those of permalloy, $Ni_{80}Fe_{20}$, with exchange stiffness $A = 13 \times 10^{-12}$ J/m, magnetization $M_s = 730$ kA/m and damping constant $\alpha = 0.01$. The simulations of the mobility curve took one week running in parallel on 48 single-threaded processes. In addition two full 3D simulations were done to verify the 2D simulations, with cell sizes of 5 nm×5 nm×6.7 nm and a wire thickness of 20.1 nm. The results of the two are in very good agreement. Simulations were also run for wires without edge defects, yielding a mobility curve with the same features and similar velocities but shifted along the field axis. Furthermore the maximum spin angle during both simulations did not exceed 40 degrees. The lens-shaped wire (FIG. 1, inset, upper profile) was 80 nm wide, 3 µm long and 5 nm thick at the center, with a unit cell size of 1 nm×1 nm×1 nm. This simulation used 6 GB of memory and ran for about 10 days with four threads on an over-clocked Intel i7 processor.

Figure 17:
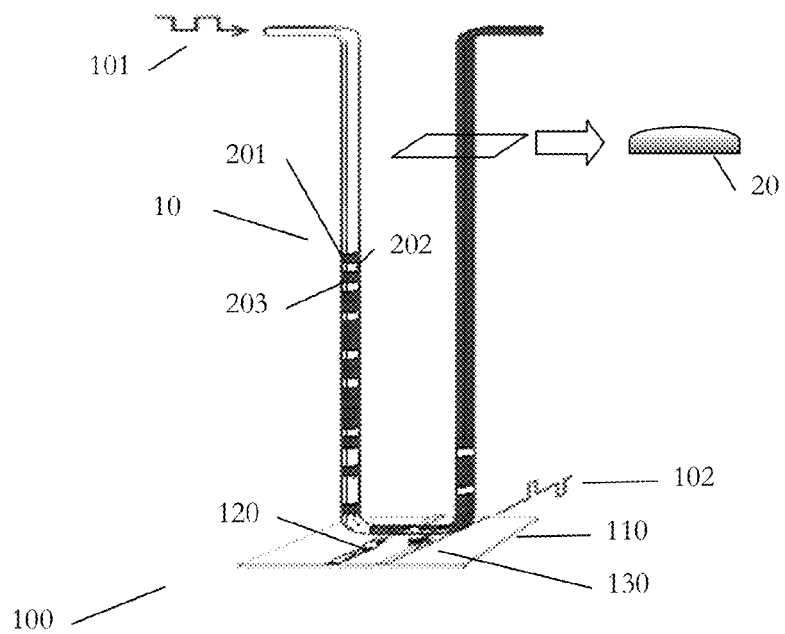
FIG. 17 is a simplified depiction of a spin-based information storage apparatus implementing a device according to embodiments of the invention.

Finally the present invention is further directed to a spin-based information storage or processing apparatus. For example, a prototypical domain-wall based apparatus that may advantageously implement a ferromagnetic device such as described above is a magnetic racetrack such as described in references [3, 4]. FIG. 17 shows such a concept in which the apparatus 100 comprises a ferromagnetic device 10 as described above.

More generally, many apparatuses based on domain wall propagation (and in particular requiring fast domain wall motion) may benefit from the device of the invention. Alternative apparatuses are logic concepts such as the magnetic domain wall logic described in reference [5, 10]. The latter concept shows domain wall logic circuits, see e.g., Table 1, or more complex circuits, see e.g., FIG. 1 or 2 of ref. [5]. Such circuits could benefit from the present cross sectional profiles, which make the walls move faster. Also, ref. [10], FIG. 1, discloses a typical NOT gate schematics which could benefit from the present invention as well. In addition, and as said in the introduction, the domain walls, shuttled through the circuit by current or field, need to stay intact to the extent that the intended logic operation can be performed. Therefore, while in typical prior art apparatuses the applied field or current is kept low to ensure a linear regime, the use of a ferromagnetic device such as described here allows for achieving higher velocities.

FIG. 17 schematically depicts a spin-based information storage apparatus 100 (a magnetic racetrack in this example). This racetrack uses a ferromagnetic nanowire 10 such as described above, i.e., the transverse section 20 of the ferromagnetic material is designed, here as a plano-convex shape, to provide domain wall velocities above the Walker breakdown limit Data are encoded as a pattern of magnetic domains 201, 202, . . . along a portion of the wire. Pulses 101 of e.g., highly spin-polarized current move the entire pattern of DWs coherently along the length of the wire 10 past read 130 and write 120 elements, arranged on a substrate 110. The nanowire is typically twice as long as the stored DW pattern, whereby the DWs can be moved in either direction. Here, a vertical-configuration is represented, i.e., it offers a high storage density by storing the pattern in the U-shaped wire normal to the plane of the substrate 110. The depiction in FIG. 17 illustrates a magnetic pattern at some point in time, e.g., essentially before moving it down the left branch of the U.

In a variant, a horizontal configuration uses a nanowire parallel to the plane of the substrate 110, as know per se. In all cases, arrays of racetracks can be arranged on a chip to enable high-density storage.

Reading 102 data from the pattern can be performed by measuring the tunnel magnetoresistance of a magnetic tunnel junction element 130 connected to the racetrack. Writing data can for instance be achieved by the fringing fields of a DW moved in a second ferromagnetic nanowire 120 oriented at right angles to the storage nanowire.

Figure 18:
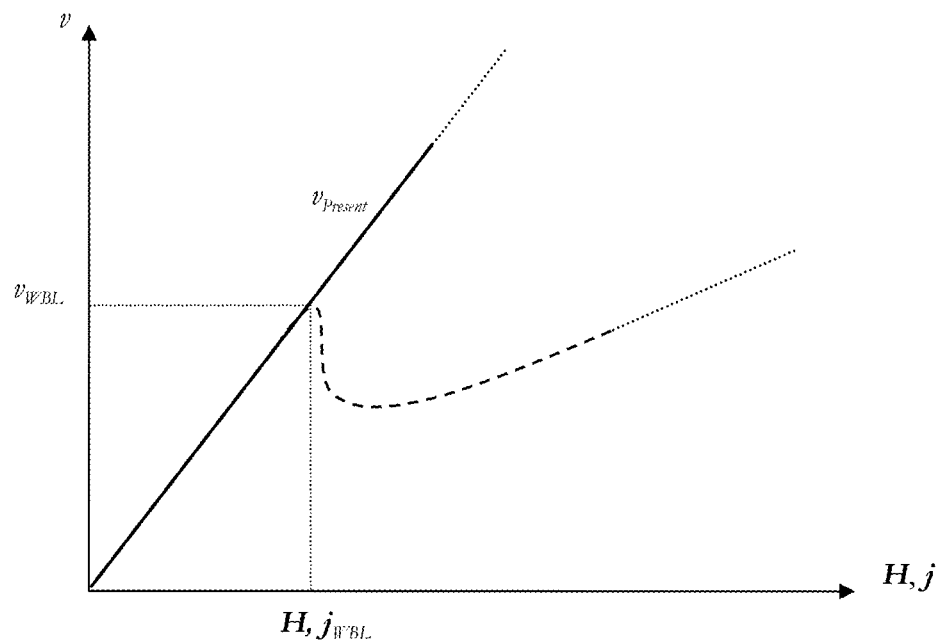
FIG. 18 is a schematic representation of velocities v as obtained in embodiments, which are substantially larger than the velocity $v_{WBL}$ as obtained for the Walker breakdown limit.

Finally, FIG. 18 is a schematic representation of velocities v as obtained in present embodiments ("$v_{Present}$", plain line), vs. velocities as typically obtained within the Walker model (dashed line), in an otherwise identical context. As illustrated, the present DW velocities are substantially larger than the velocity $v_{WBL}$ as obtained for the Walker breakdown limit. Typically v=f $v_{WBL}$, with f>1.3, preferably f>1.5, possibly f>2, the exact value off being related to the tapering geometry.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims. For example, other ferromagnetic materials than nickel-iron magnetic alloys can be relied upon, as known in the art.

Beyond the references referred to above, additional references are listed below which may provide useful information as to the background art of the present invention.

REFERENCES

1. Schryer, N. L. & Walker, L. R., J. Appl. Phys. 45, 5406-5421 (1974).
2. Beach, G. S. D., Nistor, C., Knutson, C., Tsoi, M. & Erskine, J. L. Nature Mater. 4, 741-744 (2005).
3. Parkin, S. S. P., Hayashi, M. & Thomas, L. Science 320, 190-194 (2008).
4. Parkin, S. S. P., U.S. Pat. Nos. 6,834,005; 6,898,132; 6,920, 062; 7,031,178; and 7,236,386.
5. Allwood, D. A., Xiong, G., Faulkner, C. C., Atkinson, D., Petit, D., & Cowburn R. P. Science 309, 1688 (2005).
6. Gross, L., Schlittler, R. R., Meyer, G., Vanhaverbeke, A. & Allenspach, R. Appl. Phys. Lett. 90, 093121 (2007).
7. Vanhaverbeke, A., Bischof, A., & Allenspach, R. Phys. Rev. Lett. 101, 107202 (2008).
8. Allwood, D. A. et al. Science 296, 2003-2006 (2002).
9. M. J. Donahue & D. G. Porter National Institute of Standards and Technology Interagency Report No. NISTIR 6376 (1999).
10. WO03083874 A1

ADDITIONAL REFERENCES

11. Cowburn, R. & Petit, D. Nature Mater. 4, 721-722 (2005).
12. Malozemoff, A. P. & Slonczewski, J. C. Magnetic domain walls in bubble materials. (Academic, New York, 1979).
13. Nakatani, Y., Thiaville, A. & Miltat, J. Nature Mater. 2, 521-523 (2003).
14. Glathe, S., Berkov, I., Mikolajick, T. & Mattheis, R. Appl. Phys. Lett. 93, 162505 (2008).
15. Seo, S., Lee, K., Jung, S. & Lee, H. Appl. Phys. Lett. 97, 032507 (2010).
16. Bryan, M. T., Schrefl, T., Atkinson, D. & Allwood, D. A. J. Appl. Phys. 103, 073906 (2008).
17. Kunz, A. & Reiff, S. C. Appl. Phys. Lett. 93, 082503 (2008).
18. Weerts, K., Van Roy, W., Borghs, G. & Lagae, L. Appl. Phys. Lett. 96, 062502 (2010).
19. You, C-Y. Appl. Phys. Lett. 92, 152507 (2008).
20. Lee, J.-Y., Lee, K.-S. & Kim, S.-K. Appl. Phys. Lett. 91, 122513 (2007).

21. Nakatani, Y., Thiaville, A. & Miltat, J. J. Magn. Magn. Mater. 290-291, 750-753 (2005).
22. Hayashi, M., Thomas, L., Rettner, C., Moriya, R. & Parkin, S. S. P. Nature Phys. 3, 21-25 (2007).
23. Lee, J.-Y., Lee, K.-S., Choi, S., Guslienko, K. Y. & Kim, S.-K. Phys. Rev. B 76, 184408 (2007).
24. Min, H., McMichael, R. D. Donahue, M. J., Miltat, J. & Stiles, M. D. Phys. Rev. Lett. 104, 217201 (2010).
25. Weerts, K., Neutens, P., Lagae, L. & Borghs, G. J. Appl. Phys. 103, 094307 (2008).
26. Lewis, E. R., Petit, D., O'Brien, L., Fernandez-Pacheco, A., Sampaio, J., Jausovec, A-V., Zeng, H. T., Read, D. E., & Cowburn, R. P. Nature Mater. 9, 980-983 (2010).

The invention claimed is:

1. A ferromagnetic device (10) for spin-based information storage or processing apparatus, having an elongated structure extending along a longitudinal direction (11), comprising a ferromagnetic material, wherein a transverse cross section (20) of the ferromagnetic material, perpendicular to said longitudinal direction, is designed to provide domain wall velocities substantially larger than a domain wall velocity as obtained at the Walker breakdown limit of the ferromagnetic material.

2. The ferromagnetic device of claim 1, wherein the transverse cross section is designed to substantially prevent vortex or antivortex nucleation off edges (21, 22) of the transverse cross section.

3. The ferromagnetic device of claim 1, wherein a thickness of the ferromagnetic material is reduced at the level of one or more lateral edges (21, 22) of the transverse cross-section (20), preferably along a width of 10-30 nm.

4. The ferromagnetic device of claim 1, wherein at least a portion (21-23; 23-22; 21-23) of a peripheral contour of the ferromagnetic material forms, in the transverse cross-section, a non-orthogonal convex set.

5. The ferromagnetic device of claim 4, wherein the ferromagnetic material comprises species (30) conferring a ferromagnetic character to the ferromagnetic material, and at least a portion (21-23; 23-22; 21-23) of a peripheral contour of density of said species forms a non-orthogonal convex set in the transverse cross section.

6. The ferromagnetic device of claim 4, wherein said at least a portion of peripheral contour has a plano-convex shape.

7. The ferromagnetic device of claim 3, wherein a peripheral contour of the ferromagnetic material is asymmetric with respect to a mean plane (3) of the elongated structure.

8. The ferromagnetic device of claim 3, wherein said peripheral contour realizes substantially an almost convex or convex polygon.

9. The ferromagnetic device of claim 3, wherein said ferromagnetic material comprises a nickel-iron magnetic alloy.

10. The ferromagnetic device of claim 1, wherein one or more lateral edges (21, 23) of the elongated structure are thinned or tapered edges.

11. The ferromagnetic device of claim 1, wherein a density of species that confers a ferromagnetic character to the ferromagnetic material is substantially not uniform in the transverse-cross section (20).

12. The ferromagnetic device of claim 11, wherein the device further comprises chemical species such as dopants implanted therein, arranged such that at least a portion of a peripheral contour ($C_0$) of density of said species that confers the ferromagnetic character forms a non-orthogonal convex set in the transverse cross section (20).

* * * * *